(12) United States Patent
Lee et al.

(10) Patent No.: US 8,350,276 B2
(45) Date of Patent: Jan. 8, 2013

(54) ALTERNATING CURRENT LIGHT EMITTING DEVICE

(75) Inventors: Jae Ho Lee, Ansan (KR); Lacroix Yves, Ansan (CA)

(73) Assignee: Seoul Opto Device Co., Ltd., Ansan-si (KR)

( * ) Notice: Subject to any disclaimer, the term of this patent is extended or adjusted under 35 U.S.C. 154(b) by 334 days.

(21) Appl. No.: 11/995,506

(22) PCT Filed: Aug. 8, 2006

(86) PCT No.: PCT/KR2006/003118
§ 371 (c)(1),
(2), (4) Date: Jan. 11, 2008

(87) PCT Pub. No.: WO2007/018401
PCT Pub. Date: Feb. 15, 2007

(65) Prior Publication Data
US 2008/0210954 A1   Sep. 4, 2008

(30) Foreign Application Priority Data
Aug. 8, 2005  (KR) .................. 10-2005-0072291

(51) Int. Cl.
*H01L 29/18*     (2006.01)
*H01L 33/00*     (2010.01)
*H01L 23/48*     (2006.01)
*H01L 23/52*     (2006.01)
*H01L 29/40*     (2006.01)

(52) U.S. Cl. .............. 257/88; 257/96; 257/99; 257/745; 257/E33.057; 257/E33.066

(58) Field of Classification Search .................. None
See application file for complete search history.

(56) References Cited

U.S. PATENT DOCUMENTS

| | | | |
|---|---|---|---|
| 5,094,970 A | 3/1992 | Yoshida et al. | |
| 5,936,599 A * | 8/1999 | Reymond | .................. 345/82 |
| 6,621,105 B2 | 9/2003 | Taninaka et al. | |

(Continued)

FOREIGN PATENT DOCUMENTS

JP       S54-064470       5/1979

(Continued)

OTHER PUBLICATIONS

Extended European Search Report dated Nov. 15, 2011 for PCT/KR2006003118.

*Primary Examiner* — Hoang-Quan Ho
(74) *Attorney, Agent, or Firm* — H.C. Park & Associates, PLC

(57) ABSTRACT

The present invention relates to a light emitting device. In the light emitting device of the present invention, light emitting cells of a first light emitting cell block and light emitting cells of a second light emitting cell block corresponding thereto are connected in parallel so that a current can cross the light emitting cells of the first and second light emitting cell blocks. Thus, even though a leakage current occurs in some of light emitting cells, the current is allowed to cross light emitting cells connected in another direction, thereby preventing overload on some of the light emitting cells due to the leakage current and ensuring uniform light emission and prolonged life span in the AC light emitting device.

8 Claims, 6 Drawing Sheets

U.S. PATENT DOCUMENTS

| | | |
|---|---|---|
| 6,756,611 B2 | 6/2004 | Kiyoku et al. |
| 6,770,498 B2 | 8/2004 | Hsu |
| 6,885,035 B2 | 4/2005 | Bhat et al. |
| 2002/0139987 A1* | 10/2002 | Collins et al. .................. 257/88 |
| 2004/0075399 A1* | 4/2004 | Hall .............................. 315/291 |
| 2005/0133806 A1* | 6/2005 | Peng et al. ...................... 257/99 |
| 2005/0253151 A1* | 11/2005 | Sakai et al. ..................... 257/79 |
| 2005/0254243 A1* | 11/2005 | Jiang et al. ................... 362/249 |
| 2008/0210954 A1* | 9/2008 | Lee et al. ........................ 257/88 |

FOREIGN PATENT DOCUMENTS

| | | | |
|---|---|---|---|
| JP | 2003-008083 | | 1/2003 |
| JP | 2004-006582 | * | 1/2004 |
| JP | 2004-079867 | | 3/2004 |
| JP | 2006-073815 | | 3/2006 |
| JP | 2006-073979 | | 3/2006 |
| WO | 99/20085 | | 4/1999 |
| WO | WO2005/013365 A2 | * | 2/2005 |

* cited by examiner

ALTERNATING CURRENT LIGHT EMITTING DEVICE

RELATED APPLICATION

This application is a U.S. national phase application of PCT International Application No. PCT/KR2006/003118, filed Aug. 8, 2006, which claims priority of Korean Patent Application No. 10-2005-0072291, filed Aug. 8, 2005, the contents of which are incorporated herein by reference in their entirety.

FIELD OF THE INVENTION

The present invention relates to a light emitting device, and more particularly, to an alternating current (AC) light emitting device having light emitting cells connected in parallel.

BACKGROUND OF THE INVENTION

In a conventional light emitting device, a buffer layer, an N-type semiconductor layer, an active layer and a P-type semiconductor layer are sequentially formed on a substrate. The P-type semiconductor layer and the active layer are dry-etched through a photolithographic process to expose the substrate such that a plurality of light emitting cells with a certain size are isolated from one another on the substrate. A metal layer for ohmic contact is formed on the N-type and P-type semiconductor layers. A metal film is deposited through a photo process so as to electrically connect the exposed N-type metal layer and a region exposed on the P-type metal layer of adjacent light emitting cells, and a conductive material such as gold (Au) connects the adjacent light emitting cells in the air through an air bridge process.

Thereafter, a metal bump is formed to have a thickness of about 5 to 30 μm in a region on the P-type metal layer by means of a method such as plating, thereby completing fabrication of a substrate. The device substrate fabricated as above is divided on an isolated light emitting cell basis, and flip bonding is performed such that the top of the light emitting cell is bonded to the surface of a patterned submount substrate. Thereafter, the submount substrate is cut into a certain size to be in the form of a flip chip. Each submount substrate is die-bonded on a package substrate for assembling, and an electrode of the package substrate is connected to a bonding pad on the submount substrate through a metal wire, thereby completing an alternating current (AC) flip chip.

Such an AC light emitting device has electrodes respectively connected in parallel in two different directions, and is operated in such a manner that a light emitting device array connected in a forward direction is lighted in a forward bias and a light emitting device array connected in a reverse direction is lighted in a reverse bias when the AC light emitting device is connected to an AC power source.

However, since such integrated AC light emitting cell arrays are connected in two different directions, a leakage current may flow through some of the light emitting cells of one of the light emitting cell arrays when a current flows in a forward direction and thus the light emitting cell array is lighted. At this time, the flow of an excessive current due to excessive voltage drop in the subsequent light emitting cells causes ununiform light emission of the light emitting cells, damage to the light emitting cells and shortened life span thereof.

The present invention is conceived to solve the aforementioned problems. Accordingly, an object of the present invention is to provide a light emitting device, wherein even though an excessive current occurs in some of light emitting cells, the current is allowed to cross light emitting cells connected in another direction.

Another object of the present invention is to provide a light emitting device capable of ensuring uniform light emission and prolonged life span in an AC light emitting device.

To achieve the objects, a light emitting device of the present invention comprises a substrate; and first and second light emitting cell blocks formed on the substrate and having a plurality of light emitting cells electrically connected in series to one another, respectively. Each of the light emitting cells has an N-electrode and a P-electrode. A P-electrode at one end of the first light emitting cell block is connected to an N-electrode at one end of the second light emitting cell block, and an N-electrode at the other end of the first light emitting cell block is connected to a P-electrode at the other end of the second light emitting cell block. The P-electrode of each of the light emitting cells of the first light emitting cell block and the P-electrode of each of the light emitting cells of the second light emitting cell block corresponding thereto, or the N-electrode of each of the light emitting cells of the first light emitting cell block and the N-electrode of each of the light emitting cells of the second light emitting cell block corresponding thereto are electrically connected to each other. The light emitting device may further comprise a submount substrate flip-bonded to the first and second light emitting cell blocks. Metal pads may be formed between the submount substrate and the respective light emitting cells.

Moreover, metal wires may be formed on the submount substrate, and the P-electrode of each of the light emitting cells of the first light emitting cell block and the P-electrode of each of the light emitting cells of the second light emitting cell block corresponding thereto, or the N-electrode of each of the light emitting cells of the first light emitting cell block and the N-electrode of each of the light emitting cells of the second light emitting cell block corresponding thereto may be electrically connected to each other through the metal wires.

The light emitting cell may comprise an N-type semiconductor layer formed on the substrate; a P-type semiconductor layer formed in a region on the N-type semiconductor layer; and an N-electrode and a P-electrode formed on the N-type and P-type semiconductor layers, respectively.

DESCRIPTION OF THE DRAWINGS

The above and other objects, features and advantages of the present invention will become apparent from the following description of preferred embodiments given in conjunction with the accompanying drawings, in which.

DETAILED DESCRIPTION

Figure 1:
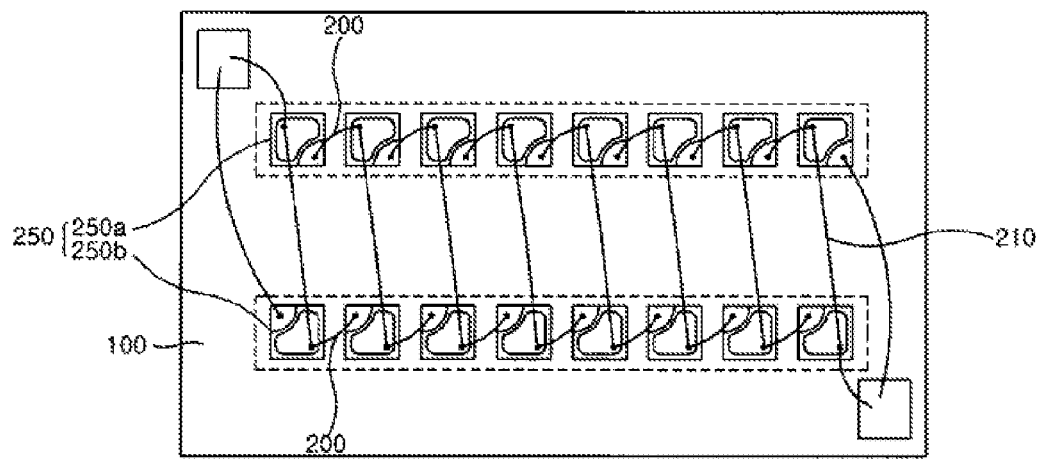
FIG. 1 is a plan view of a light emitting device according to an embodiment of the present invention.

Hereinafter, preferred embodiments of the present invention will be described in detail with reference to the accompanying drawings.

However, the present invention is not limited to the following embodiments but may be implemented into different forms. These embodiments are provided only for illustrative purposes and for full understanding of the scope of the present invention by those skilled in the art. Throughout the drawings, like elements are designated by like reference numerals.

Although first and second light emitting cell blocks to be described later will be divided and separately described, it is noted that they are light emitting cells formed on a single substrate.

FIGS. 1 to 6 are views illustrating a light emitting device according to an embodiment of the present invention.

Figure 2:
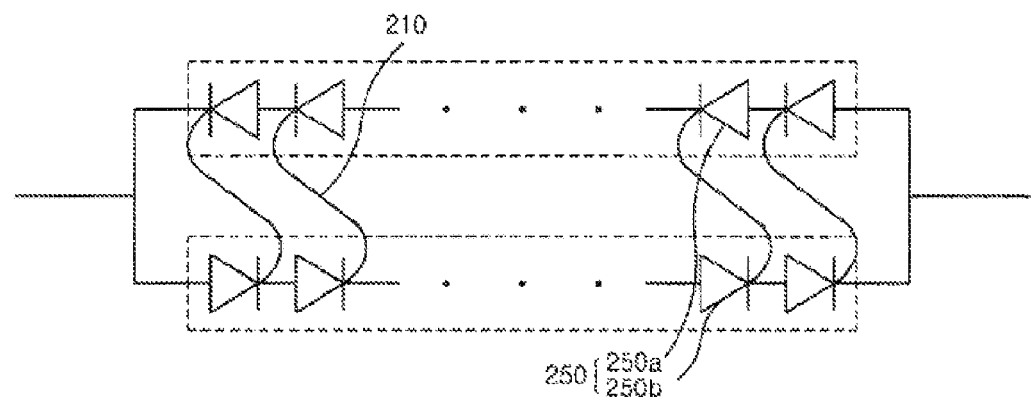
FIG. 2 is an equivalent circuit diagram of the light emitting device according to the embodiment of the present invention.

As shown in FIGS. 1 and 2, the light emitting device according to the embodiment of the present invention comprises a first light emitting cell block having a plurality of forward biased light emitting cells 250a connected in series through first wires 200 on one side on a substrate 100; a second light emitting cell block having a plurality of reverse biased light emitting cells 250b connected in series through first wires 200 on the other side on the substrate 100; and second wires 210 for electrically connecting light emitting cells 250a of the first light emitting cell block to light emitting cells 250b of the second light emitting cell block.

The substrate 100 refers to a general wafer for use in fabricating a light emitting device and is made of sapphire, SiC or the like. A substrate for crystal growth, which is made of sapphire, is used in this embodiment. That is, the aforementioned multi-layered structure is formed through epitaxial growth on the substrate for crystal growth.

The light emitting cell 250 comprises a buffer layer 110 formed on the substrate 100; an N-type semiconductor layer 120 formed on the buffer layer 110; an active layer 140 formed in a certain region on the N-type semiconductor layer 120; a P-type semiconductor layer 160 formed on the active layer 140; an N-electrode 125 formed on the N-type semiconductor layer 120; and a P-electrode 165 formed on the P-type semiconductor layer 160.

The buffer layer 110 is a layer for reducing lattice mismatch between the substrate 100 and the subsequent layers upon growth of crystals, and contains AlN or GaN that is a nitride semiconductor material.

The N-type semiconductor layer 120 is a layer in which electrons are produced, and formed of an N-type compound semiconductor layer and an N-type clad layer. At this time, the N-type compound semiconductor layer is made of GaN doped with N-type impurities.

The active layer 140 is a region in which electrons and holes are recombined, has a predetermined band gap, and may be formed to have a quantum well structure. Further, the active layer 140 may contain InGaN, and the wavelength of emitted light, which is generated due to the combination of the electrons and the holes, varies depending on the kind of a material constituting the active layer 140. Therefore, it is preferred that a semiconductor material of which the composition is controlled depending on a target wavelength be used for the active layer 140.

The P-type semiconductor layer 160 is a layer in which holes are produced, and formed of a P-type clad layer and a P-type compound semiconductor layer. At this time, the P-type compound semiconductor layer is made of AlGaN doped with P-type impurities.

The N-electrode 125 and the P-electrode 165 are electrodes for use in electrically connecting the light emitting cell 250 to external wiring, and the N-electrode 125 may be formed to have a lamination structure of Ti/Au. The P-electrode 165 is formed of a transparent conductive thin film (Indium Tin Oxide, ITO) and uniformly transmits a voltage input through the first wire 200 to the P-type semiconductor layer 160.

Further, the first wire 200 is formed of a conductive material such as gold (Au) by means of a method such as plating so as to connect the N-type and P-type semiconductor layers 120 and 160 adjacent to each other.

The second wire 210 is to electrically connect the light emitting cell 250a of the first light emitting cell block and the light emitting cell 250b of the second light emitting block corresponding thereto, and is formed of a metal such as gold (Au). That is, as shown in an equivalent circuit of FIG. 2 according to this embodiment, the forward and reverse biased light emitting cells 250a and 250b are connected in parallel through the second wires 210. Thus, even though an excessive current occurs in some of the light emitting cells in one direction when AC power is applied to the light emitting cells, the current is allowed to cross the light emitting cells connected in the other direction, thereby preventing damage to the light emitting cells 250 due to the excessive current.

FIGS. 3 to 6 are sectional views illustrating a process of fabricating the light emitting device according to the embodiment of the present invention.

Figure 3:
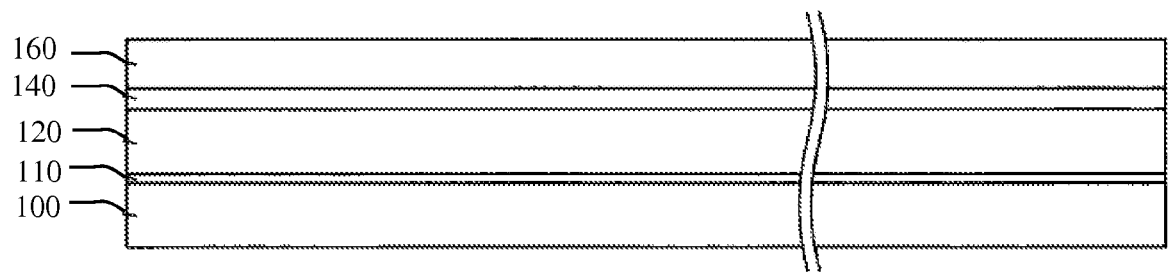
FIGS. 3 to 6 are sectional views illustrating a process of fabricating the light emitting device according to the embodiment of the present invention.

The process of fabricating the aforementioned light emitting device will be discussed below with reference to FIGS. 3 to 6. A buffer layer 110, an N-type semiconductor layer 120, an active layer 140 and a P-type semiconductor layer 160 are sequentially formed on a sapphire substrate 100 (FIG. 3). Thereafter, a photoresist is applied to an entire structure, and a first photoresist pattern for use in patterning each of the light emitting cells is then formed by performing a photolithographic process using a mask.

Figure 4:
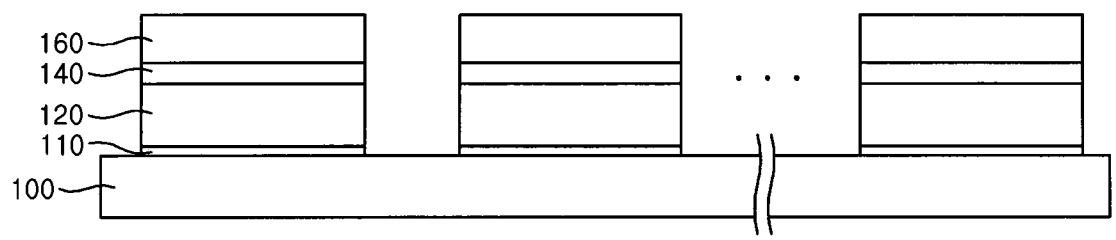

Next, the P-type semiconductor layer 160, the active layer 140, the N-type semiconductor layer 120 and the buffer layer 110 are partially removed through an etching process using the first photoresist pattern as an etching mask, and the first photoresist pattern is removed to physically and electrically isolate light emitting cell patterns (FIG. 4).

A photoresist is applied to the entire structure, and a second photoresist pattern is then formed by performing a photolithographic process using a mask.

Figure 5:
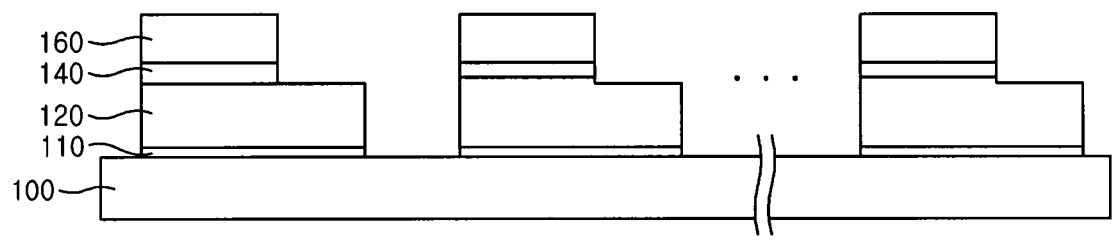

Next, the P-type semiconductor layer 160 and the active layer 140 are partially removed to expose the N-type semiconductor layer 120 by performing an etching process using the second photoresist pattern as an etching mask (FIG. 5). At this time, the N-type semiconductor layer 120 may also be removed together with a predetermined thickness.

Thereafter, the second photoresist pattern is removed through a predetermined stripping process.

Figure 6:
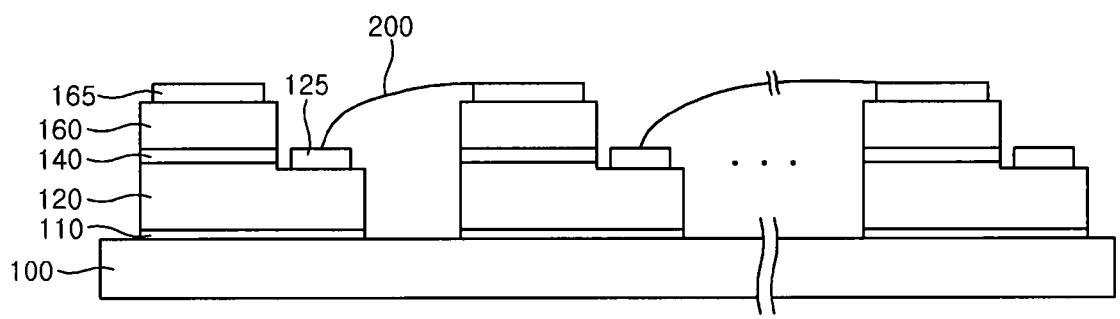

A transparent conductive thin film is formed on the P-type semiconductor layer 160 to fabricate a P-electrode 165. That is, a third photoresist pattern through which the P-type semiconductor layer 160 is exposed is formed, the P-electrode 165 is then formed on the third photoresist pattern, and the third photoresist pattern is then removed through a stripping process so that the P-electrode 165 are formed on the P-type semiconductor layer 160. Next, an N-electrode 125 is formed on the N-type semiconductor conductor layer 120 out of a conductive film of a metal such as Ti, Au, Ag, Pt, Al or Cu. Thereafter, an N-electrode 125 of one light emitting cell and a P-electrode 165 of another light emitting cell adjacent thereto are connected by a first wire 200 through an air bridge or step coverage process, thereby fabricating first and second light emitting cell blocks (FIG. 6).

An N-electrode 125 and a P-electrode 165 at both ends of the aforementioned first light emitting cell block are respectively connected to a P-electrode 165 and an N-electrode 125 at both ends of the second light emitting cell block of which the directions of anode and cathode are opposite to those of the first light emitting cell block. The light emitting cell 250 a of the first light emitting cell block and the light emitting cell 250 b of the second light emitting cell block corresponding thereto are connected by a second wire 210 through an air bridge or step coverage process, thereby completing an AC light emitting device (see FIG. 1).

Figure 13:
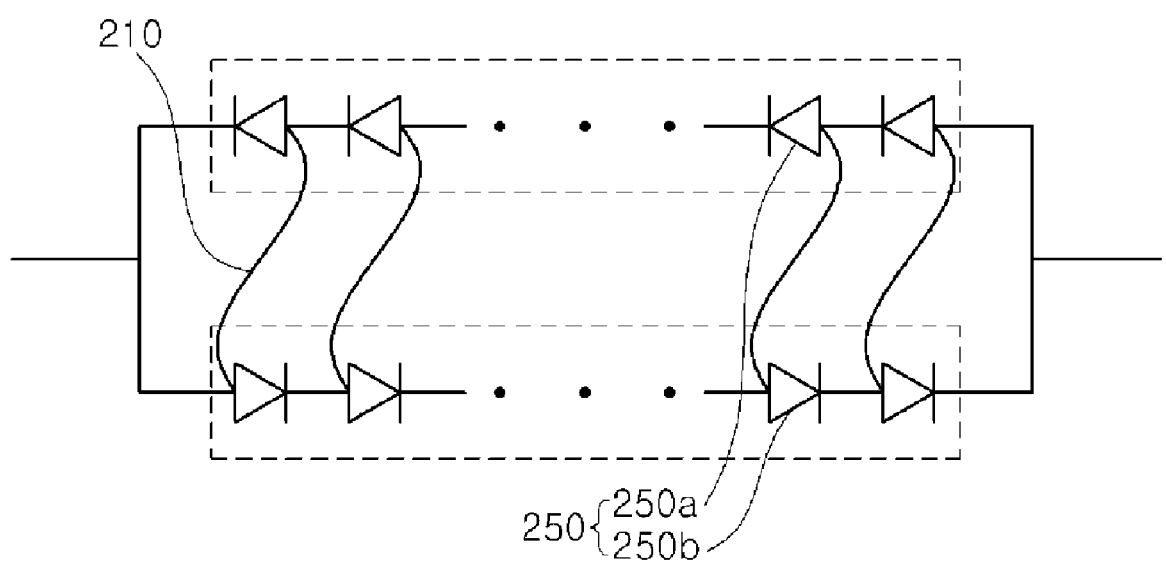
FIG. 13 is an equivalent circuit diagram of the light emitting device according to the embodiment of the present invention.

At this time, as shown in FIG. 2, although the N-electrodes 125 of the light emitting cells are connected to each other through the second wire 210, it will be apparent that the P-electrodes 165 may also be connected to each other through the second wire 210, as shown in FIG. 13. Further, although the first and second wires are formed through two processes in the aforementioned process, they may be simultaneously formed through a single process.

The air bridge process is performed as follows. A photosensitive liquid is applied and developed through a photo process between chips to be connected to each other so as to form a photoresist pattern; a thin film is first formed on the photoresist pattern out of a material such as a metal or the like by means of a method such as vacuum deposition; and a gold-containing conductive material is applied again to a certain thickness on the thin film by means of a method such as plating or metal deposition. Thereafter, the photoresist pattern is removed using a solvent solution so that all the portions below the conductive material are removed and only the conductive material in the form of a bridge is formed in the air.

Further, in the step coverage process, a photosensitive liquid is applied and developed through a photo process between chips to be connected to each other such that portions to be connected to each other are left uncovered while the other portions are covered with a photoresist pattern, and a gold-containing conductive material is applied to a certain thickness on the photoresist pattern by means of a method such as plating or metal deposition. Subsequently, the photoresist pattern is removed using a solvent solution so that all the portions that are not covered with the conductive material are removed and only the covered portions are left to function to electrically connect the chips to be connected to each other.

Next, a light emitting device according to another embodiment of the present invention, which has a flip chip structure with corresponding light emitting cells connected through metal bumps of a submount substrate, will be described. Descriptions overlapping with those of the aforementioned embodiment will be omitted in the following embodiment.

Figure 7:
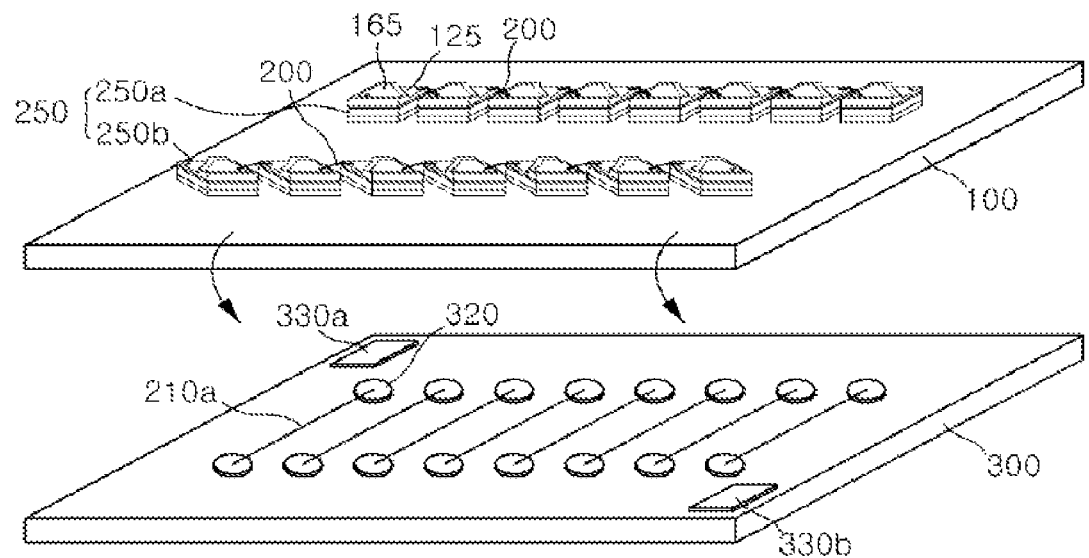
FIG. 7 is a perspective view of a light emitting device according to another embodiment of the present invention.
Figure 8:
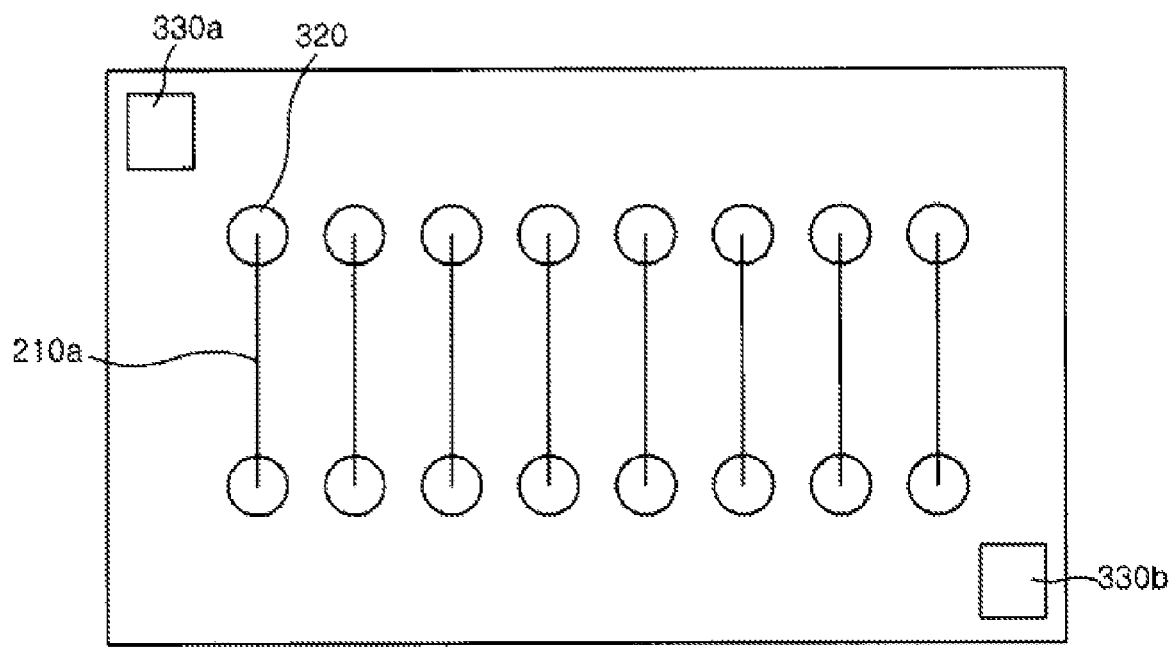
FIGS. 8 and 9 are plan views of a submount substrate in the light emitting device according to the other embodiment of the present invention.
Figure 9:
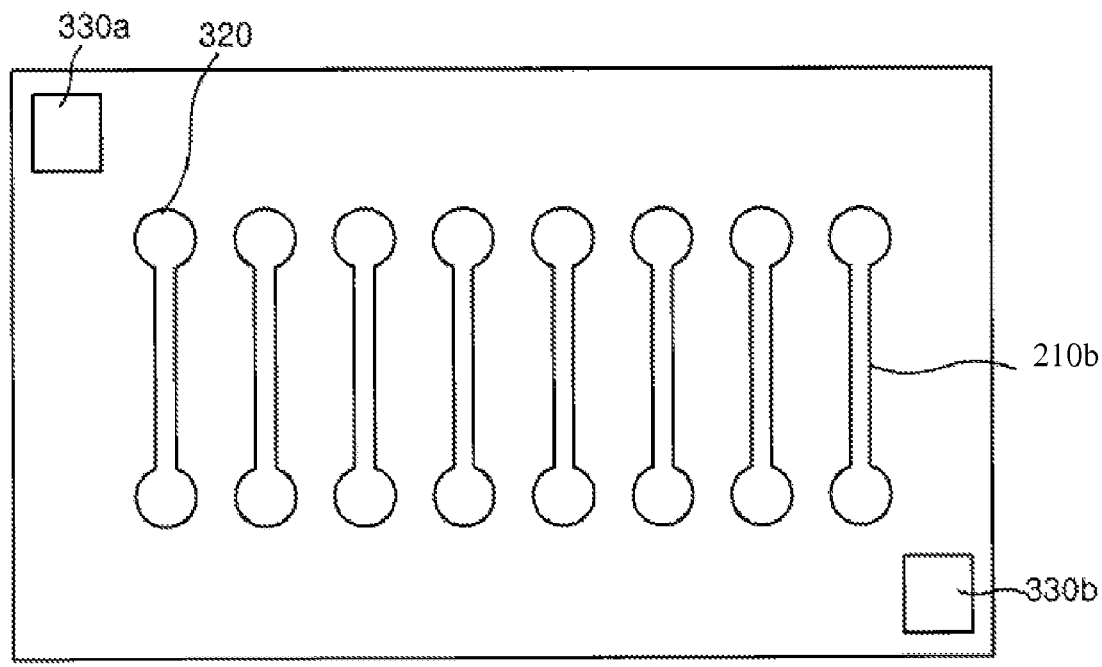

FIGS. 7 to 9 are views illustrating another embodiment of the present invention.

FIG. 7 shows a light emitting device according to the another embodiment of the present invention. The light emitting device comprises a substrate 100 including a first light emitting cell block having a plurality of forward biased light emitting cells 250 a connected in series on one side on a substrate 100 and a second light emitting cell block having a plurality of reverse biased light emitting cells 250 b connected in series on the other side on the substrate 100; and a submount substrate 300 flip-bonded to the first substrate so as to electrically connect a P-electrode 165 of each of light emitting cells 250 a of the first light emitting cell block and a P-electrode 165 of each of light emitting cells 250 b of the second light emitting cell block to each other.

Metal bumps are used for the flip-bonding to the submount substrate 300 and formed on the P-electrodes 165. The metal bumps are flip-bonded through an ultrasonic bonding or reflow soldering process for a predetermined period of time and at a predetermined temperature. Although gold (Au), Pb/Sn or the like may be used for the metal bumps 180, Pb/Sn is used in this embodiment.

The ultrasonic bonding process is a process used in a case where the metal bump 180 has a high melting point like gold (Au). Vertical pressure and horizontal ultrasonic vibration of 60 Hz are applied to achieve bonding at the room temperature. Since an oxide film is broken by means of the pressure and the vibration to generate metal contact and an operation is performed at the room temperature, a cold weld is formed.

The reflow soldering process is a process used in a case where the metal bump 180 is made of an alloy such as Pb/Sn having a low melting point. The reflow soldering process is used to electrically connect a printed circuit wiring board and electronic components by passing the printed circuit wiring board, which has creamy solder supplied thereto and the electronic components mounted thereon, through a heating furnace with an high temperature atmosphere in which a soldering temperature is set. This is classified into infrared reflow, hot air reflow, infrared and hot air reflow, reflow using latent heat of vaporization of an inert solvent and the like, according to a heating source.

The first light emitting cell block has the forward biased light emitting cells 250a connected in series through the first wires 200 made of a metal. The second light emitting cell block has the same structure as the first light emitting cell block but has the reverse biased light emitting cells 250b connected in series through the first wires 200. When AC power is applied, the first light emitting cell block is lighted in case of a positive voltage and the second light emitting cell block is lighted in case of a negative voltage.

The submount substrate 300 is to dissipate heat from the light emitting cells 250 and to apply external power to the light emitting cells. An electrode of each of the light emitting cells of the first light emitting cell block and an electrode of each of the light emitting cells of the second light emitting cell block are connected to each other on the submount substrate 300 through a metal wire. That is, metal pads 320 are formed on the submount substrate 300 to electrically connect the P-electrodes 165 of the forward biased light emitting cells 250a and the P-electrodes of the reverse biased light emitting cells 250b corresponding thereto. At this time, the metal pads 320 may be connected through second wires 210a as shown in FIG. 8 or wires 210b for making connection between the metal pads 320 formed when the metal pads are formed on the submount substrate 300 as shown in FIG. 9.

Each of the light emitting cells further comprises a metal bump 180 formed on the P-electrode 165 as compared with the light emitting cell according to the aforementioned embodiment. The P-electrode 165 is an ohmic electrode and functions to uniformly transmit a voltage input through the first wire 200 to the P-type semiconductor layer 160.

Figure 10:
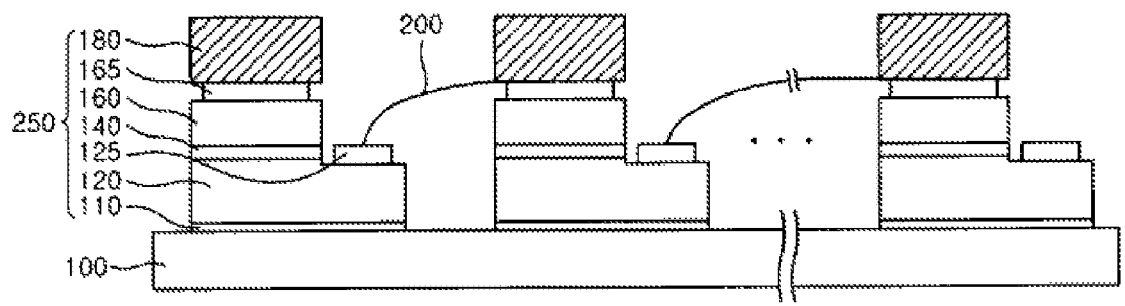
FIGS. 10 to 12 are sectional views illustrating a process of fabricating the light emitting device according to the other embodiment of the present invention.
Figure 11:
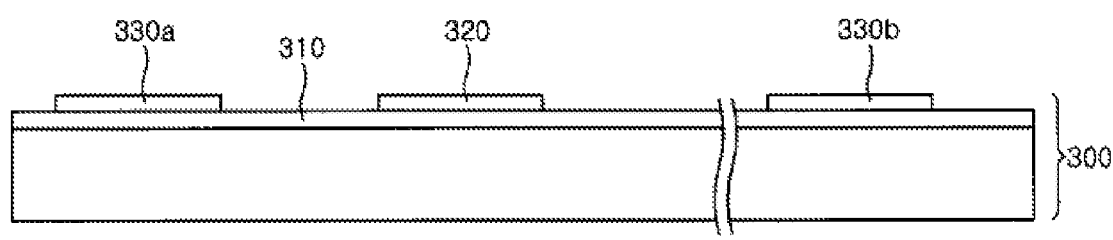
Figure 12:
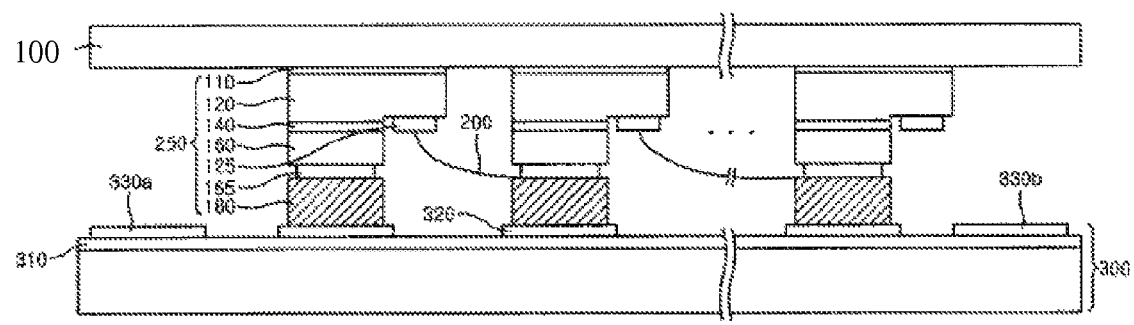

FIGS. 10 to 12 are sectional views illustrating a process of fabricating the light emitting device according to the other embodiment of the present invention.

The process of fabricating the aforementioned light emitting device will be discussed with reference to FIGS. 10 to 12. In the light emitting device according to the other embodiment of the present invention, semiconductor layers are formed on a substrate 100 through the same method as the aforementioned embodiment, a process of connecting an N-electrode 125 of one light emitting cell and a P-electrode 165 of another light emitting cell adjacent thereto using a first wire 200 through an air bridge or step coverage process is performed, and a metal bump 180 made of an alloy such as Pb/Sn is bonded to the top of the P-electrode 165 to fabricate first and second light emitting cell blocks (FIG. 10).

At this time, to prevent the metal bump 180 from flowing to other places due to its wetness when the metal bump 180 is melted, a passivation layer (not shown) may be formed around the metal bump. The passivation layer functions not only to insulate the metal bump 180 but also to protect the light emitting cell 250 from impurities, moisture or the like.

A P-electrode 165 and an N-electrode 125 at both ends of the first light emitting cell block and an N-electrode 125 and a P-electrode 165 at both ends of the second light emitting cell block are respectively connected to each other to complete a first substrate.

Meanwhile, a submount substrate 300 has a lower layer made of a material with electric and thermal conductivity, such as SiC, Si, Ge, SiGe, AlN or a metal, and is manufactured using a separate mold. A dielectric film 310 made of a dielectric material in which a current of 1 µA or less flows or an insulation material in which a current does not completely flow is formed on the entire surface of the lower layer. At this time, if a conductive material is not used for the lower layer of the submount substrate 300, the dielectric film 310 may not be formed. In this embodiment, a metallic material that is a material with superior electric conductivity is used to enhance thermal conductivity. Thus, the dielectric film 310 is formed to provide sufficient insulation. Thereafter, metal pads 320 made of a metal such as Cr, Au, Ti or Cu are formed on the dielectric film 310 of the submount substrate 300 by means of a screen printing method or a deposition process using a predetermined mask pattern so that the metal bumps 180 of the first substrate can be bonded to the submount substrate 300 due to its wetness.

After the metal pads 320 have been formed, bonding pads 330a and 330b to be connected to the outside are formed at both ends of the submount substrate 300, thereby completing the submount substrate 300 (FIG. 11).

Thereafter, the first substrate and the submount substrate 300 are bonded to each other through a flip chip process (FIG. 12). That is, the metal bumps 180 formed on the P-electrodes 165 of the first substrate are formed to have spherical shapes through a reflow soldering process, and the P-electrodes of the forward and reverse biased light emitting cells 250a and 250b are bonded to the metal pads 320 of the submount substrate 300.

At this time, the P-electrode 165 of each of the forward biased light emitting cells 250a and the P-electrode 165 of each of the reverse biased light emitting cells 250b corresponding thereto are electrically connected to each other through the metal pad 320.

The metal pads 320 are connected to each other through the second wire 210, or they may be manufactured to be connected to each other by forming a wire when the metal pads 320 are formed.

Although the electrodes of the respective light emitting cell blocks are connected to each other through the metal wires on the submount substrate 300 as described above, the present invention is not limited thereto. The electrodes of the respective light emitting cell blocks may be connected to each other on the first substrate. That is, the P-electrode 165 of each of the first light emitting cells 250a of the first light emitting cell block and the P-electrode 165 of each of the light emitting cells of the second light emitting cell block corresponding thereto are electrically connected to each other on the first substrate through the second wire 210 by means of the same method as the aforementioned embodiment.

Since the metal bumps 180 are bonded using a reflow soldering process in the flip chip process, it is possible to obtain a self-aligning effect.

After the process has been performed, the submount substrate 300 is cut into a certain size to be in a flip chip form, die bonding is performed such that each of the submount substrates 300 is mounted on the substrate (not shown) for assembling, and electrodes of the substrate for assembling are connected to the bonding pads 330a and 330b of the submount substrate 300 through wires, thereby completing an AC flip chip.

The die bonding is one of semiconductor component assembling techniques and is a technique of mounting a semiconductor chip on a package. The die bonding is used to fix a semiconductor chip on a package and to perform electrical connection between the chip and the package. Generally, a thermocompression bonding or ultrasonic bonding technique is used for the die bonding.

As described above, according to the present invention, a plurality of light emitting cells formed in an AC light emitting device are connected in parallel to one another. Thus, it is possible to provide a light emitting device, wherein even though a leakage current occurs in some of light emitting cells, the current is allowed to cross light emitting cells connected in another direction, thereby preventing overload on some of the light emitting cells due to the leakage current and ensuring uniform light emission and prolonged life span in the AC light emitting device.

The scope of the present invention is not limited to the aforementioned embodiments but is defined by the appended claims. It will be apparent that those skilled in the art can make various changes and modifications thereto within the scope defined by the claims.

The invention claimed is:

1. A light emitting device, comprising:
a substrate;
a first light emitting cell block disposed on the substrate; and
a second light emitting cell block disposed on the substrate,
wherein each of the first light emitting cell block and the second light emitting cell block comprise a plurality of light emitting cells electrically connected in series to one another via first wires, each of the light emitting cells comprising an N-electrode and a P-electrode,
wherein a P-electrode at a first end of the first light emitting cell block is connected to an N-electrode at a first end of the second light emitting cell block, and an N-electrode at a second end of the first light emitting cell block is connected to a P-electrode at a second end of the second light emitting cell block, and
wherein each of the light emitting cells of the first light emitting cell block is connected to a corresponding light emitting cell of the second light emitting cell block by either:
the P-electrode of each of the light emitting cells of the first light emitting cell block being directly connected to a corresponding P-electrode of the corresponding light emitting cell of the second light emitting cell block, or
the N-electrode of each of the light emitting cells of the first light emitting cell block being directly connected to a corresponding N-electrode of the corresponding light emitting cell of the second light emitting cell block.

2. The light emitting device of claim 1, further comprising a submount substrate flip-bonded to the first light emitting cell block and the second light emitting cell block.

3. The light emitting device of claim 2, further comprising metal pads disposed between the submount substrate and the light emitting cells.

4. The light emitting device of claim 2, further comprising second wires disposed on the submount substrate, wherein the P-electrode of each of the light emitting cells of the first light emitting cell block is directly connected to the corresponding P-electrode of the corresponding light emitting cell of the second light emitting cell block via the second wires, or the N-electrode of each of the light emitting cells of the first light emitting cell block is directly connected to the corresponding N-electrode of the corresponding light emitting cell of the second light emitting cell block via the second wires.

5. The light emitting device of claim 4, further comprising metal pads connected through the second wires formed between the metal pads.

6. The light emitting device of claim 1, wherein each light emitting cell comprises:
    an N-type semiconductor layer disposed on the substrate;
    a P-type semiconductor layer disposed on the N-type semiconductor layer;
    an N-electrode disposed on the N-type semiconductor; and
    a P-electrode disposed on the P-type semiconductor layer.

7. The light emitting device of claim 3, further comprising metal wires disposed on the submount substrate, wherein the P-electrode of each of the light emitting cells of the first light emitting cell block is directly connected to the corresponding P-electrode of the corresponding light emitting cell of the second light emitting cell block via the metal wires, or the N-electrode of each of the light emitting cells of the first light emitting cell block is directly connected to the corresponding N-electrode of the corresponding light emitting cell of the second light emitting cell block via the metal wires.

8. A light emitting device, comprising:
    a substrate;
    a first light emitting cell block disposed on the substrate; and
    a second light emitting cell block disposed on the substrate,
    wherein each of the first light emitting cell block and the second light emitting cell block comprise a plurality of light emitting cells electrically connected in series to one another, each of the light emitting cells comprising an N-electrode and a P-electrode,
    wherein a P-electrode at a first end of the first light emitting cell block is connected to an N-electrode at a first end of the second light emitting cell block, and an N-electrode at a second end of the first light emitting cell block is connected to a P-electrode at a second end of the second light emitting cell block,
    wherein each of the light emitting cells of the first light emitting cell block is disposed a number of light emitting cells away from the first end of the first light emitting cell block, and corresponds to a light emitting cell of the second light emitting cell block that is disposed an equal number of light emitting cells away from the first end of the second light emitting cell block,
    wherein each of the light emitting cells of the first light emitting cell block is connected to a corresponding light emitting cell of the second light emitting cell block by either:
        the P-electrode of each of the light emitting cells of the first light emitting cell block being directly connected to a corresponding P-electrode of the corresponding light emitting cell of the second light emitting cell block, or
the N-electrode of each of the light emitting cells of the first light emitting cell block being directly connected to a corresponding N-electrode of the corresponding light emitting cell of the second light emitting cell block.

\* \* \* \* \*